(12) United States Patent
Kim et al.

(10) Patent No.: US 7,709,928 B2
(45) Date of Patent: May 4, 2010

(54) ELECTROMIGRATION FUSE AND METHOD OF FABRICATING SAME

(75) Inventors: Deok-kee Kim, Bedford Hills, NY (US); Haining Sam Yang, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 167 days.

(21) Appl. No.: 11/869,227

(22) Filed: Oct. 9, 2007

(65) Prior Publication Data

US 2009/0090994 A1    Apr. 9, 2009

(51) Int. Cl.
    *H01L 29/00* (2006.01)
(52) U.S. Cl. ............... 257/529; 257/E23.149; 438/601
(58) Field of Classification Search ......... 257/529, 257/665, 755, E23.149; 438/381, 132, 467, 438/601
See application file for complete search history.

(56) References Cited

U.S. PATENT DOCUMENTS

| | | | |
|---|---|---|---|
| 6,337,507 B1 * | 1/2002 | Bohr et al. .......... | 257/529 |
| 6,433,404 B1 | 8/2002 | Iyer et al. | |
| 6,433,409 B2 | 8/2002 | Mita et al. | |
| 6,624,499 B2 | 9/2003 | Kothandaraman et al. | |
| 2004/0209404 A1 | 10/2004 | Wang et al. | |
| 2005/0285224 A1 | 12/2005 | Tsutsui | |
| 2006/0118904 A1 | 6/2006 | Liaw | |
| 2006/0270208 A1 | 11/2006 | Wang et al. | |

* cited by examiner

*Primary Examiner*—Mark Prenty
(74) *Attorney, Agent, or Firm*—Schmeiser, Olsen & Watts; Ian D. MacKinnon

(57) ABSTRACT

Fuses and methods of forming fuses. The fuse includes: a dielectric layer on a semiconductor substrate; a cathode stack on the dielectric layer, a sidewall of the cathode stack extending from a top surface of the cathode stack to a top surface of the dielectric layer; a continuous polysilicon layer comprising a cathode region, an anode region, a link region between the cathode and anode regions and a transition region between the cathode region and the link region, the transition region proximate to the sidewall of the cathode stack, the cathode region on a top surface of the cathode stack, the link region on a top surface of the dielectric layer, both a first thickness of the cathode region and a second thickness of the link region greater than a third thickness of the transition region; and a metal silicide layer on a top surface of the polysilicon layer.

20 Claims, 8 Drawing Sheets

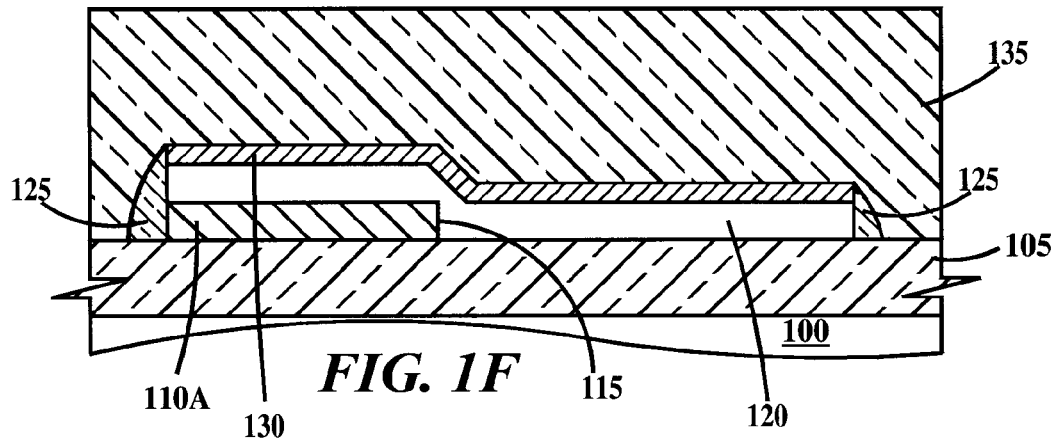
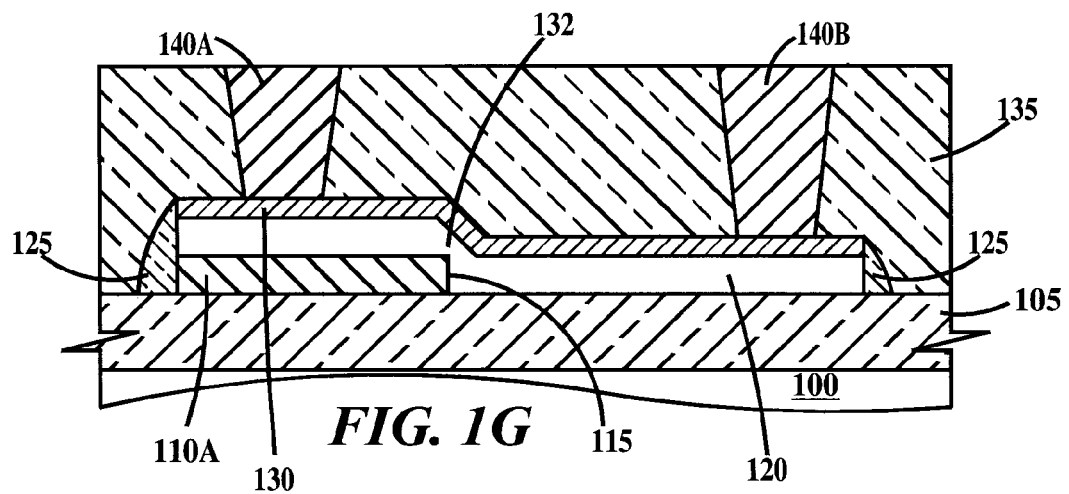
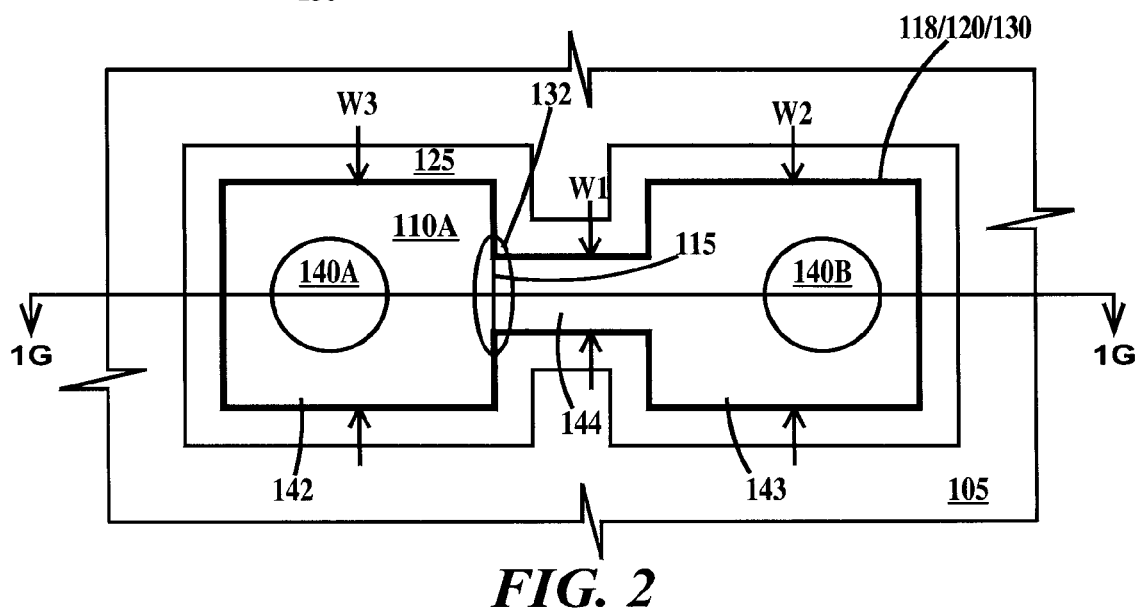

ELECTROMIGRATION FUSE AND METHOD OF FABRICATING SAME

FIELD OF THE INVENTION

The present invention relates to the field of integrated circuits; more specifically, it relates to electromigration fuses and methods of fabricating electromigration fuses.

BACKGROUND OF THE INVENTION

Electromigration fuses are devices that are often used in integrated circuits. The fuses conduct electricity between a cathode and an anode in the shorted state and are programmed to an open state by passing a sufficiently large current through the fusible link region of the fuse. A particular problem associated with electromigration fuses (electromigration fuses) is that it requires high energy (i.e., high current and voltage) to program. For example, conventional electromigration fuse programming voltages are about 3 volts while most logic circuit applications run at about 1 volt. The integration of the current high voltage electromigration fuse requires separate power supply as well as large driving devices to provide high current. Therefore, there exists a need for electromigration fuses and methods of making electromigration fuses that can be programmed using lower energy.

SUMMARY OF THE INVENTION

A first aspect of the present invention is a structure, comprising: a dielectric layer on a semiconductor substrate; a cathode stack on a top surface of the dielectric layer, a sidewall of the cathode stack extending from a top surface of the cathode stack to the top surface of the dielectric layer; a continuous polysilicon layer, the polysilicon layer comprising a cathode region, an anode region, a link region between the cathode and anode regions and a transition region between the cathode region and the link region, the transition region proximate to the sidewall of the cathode stack, the sidewall of the cathode stack under the transition region, the cathode region on a top surface of the cathode stack, the link region on a top surface of the dielectric layer, both a first thickness of the cathode region and a second thickness of the link region greater than a third thickness of the transition region; and a metal silicide layer on a top surface of the polysilicon layer.

A second aspect of the present invention is a method, comprising: forming a dielectric layer on a semiconductor substrate; forming a cathode layer on a top surface of the dielectric layer; removing a portion of the cathode layer to form a sidewall extending from a top surface of the cathode layer to the top surface of the dielectric layer; forming a polysilicon layer on the top surface of the cathode layer, the sidewall of the cathode layer and the top surface of the dielectric layer; simultaneously patterning the cathode layer into a cathode stack and patterning the polysilicon layer into a patterned polysilicon layer having a cathode region, an anode region, a link region between the cathode and anode regions and a transition region between the cathode region and the link region, the transition region proximate to the sidewall of the cathode stack, the sidewall of the cathode stack under the transition region, the cathode region on a top surface of the cathode stack, the link region on the top surface of the dielectric layer, the cathode region, the transition region, the link region and the anode region contiguous, a first thickness of the cathode region and a second thickness of the link region greater than a third thickness of the transition region; and forming a metal silicide layer on a top surface of the patterned polysilicon layer.

A third aspect of the present invention is a method, comprising: forming a dielectric layer on a semiconductor substrate; forming a cathode layer on a first region of the top surface of the dielectric layer; forming an anode layer on a second region of the top surface of the dielectric layer, the first region of the top surface of the dielectric layer abutting the second region of the top surface of the dielectric layer; removing a portion of the cathode layer adjacent to the anode layer to form a first sidewall extending from a top surface of the cathode layer to the top surface of the dielectric layer and to form a second sidewall extending from a top surface of the anode layer to the top surface of the dielectric layer; forming a polysilicon layer on the top surface of the cathode layer, the first sidewall, the top surface of the anode layer, the second sidewall and the top surface of the dielectric layer; simultaneously patterning the cathode layer into a cathode stack, the anode layer into an anode stack and the polysilicon layer into a patterned polysilicon layer, the patterned polysilicon layer having a cathode region, an anode region, a link region between the cathode and anode regions, a first transition region between the cathode region and the link region and a second transition region between the link region and the anode region, the transition region proximate to the first sidewall and the second transition region proximate to the second sidewall, the first sidewall of the cathode stack under the first transition region and the second sidewall of the anode stack under the second transition region, the cathode region on a top surface of the cathode stack, the link region on a top surface of the dielectric layer, the anode region on the top surface of the anode stack, the cathode region, the transition region, the link region and the first and second transition regions contiguous, both a first thickness of the cathode region and a second thickness of the link region greater than a third thickness of the first transition region, both a fourth thickness of the anode region and the second thickness of the link region greater than a fifth thickness of the second transition region; and forming a metal silicide layer on a top surface of the patterned polysilicon layer.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 1A through 1G are cross-sectional drawings illustrating fabrication of an electromigration fuse according to a first embodiment of the present invention;

FIG. 2 is a plan view of the fuse according to the first embodiment of the present invention;

DETAILED DESCRIPTION OF THE INVENTION

Electromigration fuses according to the embodiments of the present invention comprise polysilicon and metal silicide layers. Fuses according to the embodiments of the present invention include a link region between cathode and anode regions of the fuse and are programmed by passing a current through the fuse. The current causes electromigration of the metal silicide material from the cathode region through the link region to the anode region of the fuse, causing a physical gap to appear in the metal silicide layer between the cathode and anode regions, but still having some electrical conduction between the cathode and anode regions through the polysilicon layer. The state of the fuse, low resistance (metal silicide layer intact) or high resistance (metal silicide layer not intact) is measured by sense circuits.

Figure 1A:
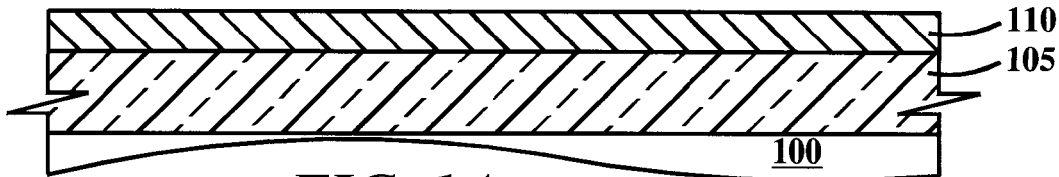

FIGS. 1A through 1G are cross-sectional drawings illustrating fabrication of an electromigration fuse according to a first embodiment of the present invention. In FIG. 1A, formed on a semiconductor substrate 100, is a dielectric layer 105. Formed on dielectric layer 105 is a base layer 110. Base layer 110 may comprise a single layer or a stack of two or more layers. Base layer 110 may comprise a dielectric layer (e.g., silicon oxide, silicon nitride or metal oxide including rare earth metal, oxides), an electrically conductive layer (e.g., polysilicon, a metal or conductive metal nitride) or a combination of one or more dielectric layers and one or more conductive layers. A rare earth metal has an atomic number of 57 through 71. In one example, base layer 110 is between about 20 nm to about 60 nm thick. Semiconductor substrate 100 may include portions of integrated circuits such as the semiconductor portions of transistor, diodes and resistors.

Figure 1B:
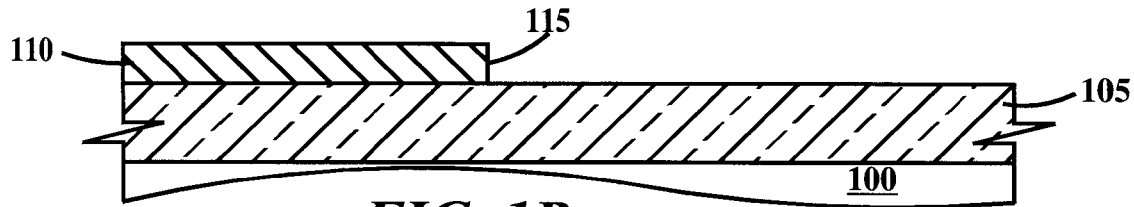

In FIG. 1B, a region of base layer 110 is removed to expose a sidewall 115 of the base layer extending from a top surface of the base layer to a top surface of dielectric layer 105. It is advantageous, though not necessary, that sidewall 115 be about perpendicular to the top surface of dielectric layer 105.

Figure 1C:
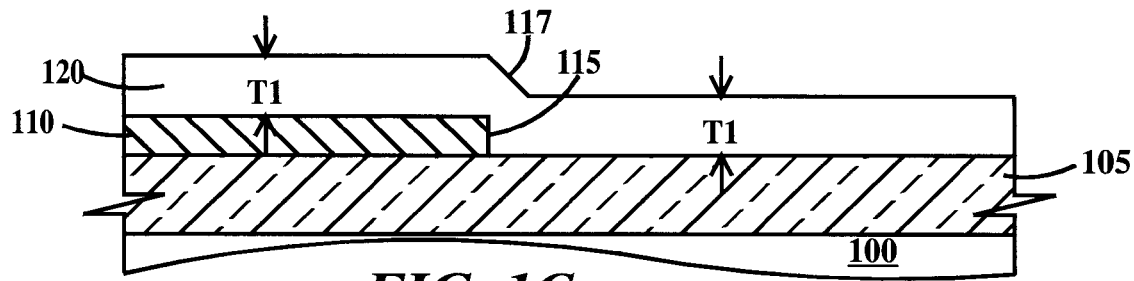

In FIG. 1C a polysilicon layer 120 is formed over the top surface of base layer 110 and exposed regions of the top surface of dielectric layer 105. Polysilicon layer is 120 has about the same thickness T1 on base layer 110 and on dielectric layer 105, so a step 117 is formed in the polysilicon layer over sidewall 115. In one example T1 is between about 40 nm to about 70 mm.

Figure 1D:
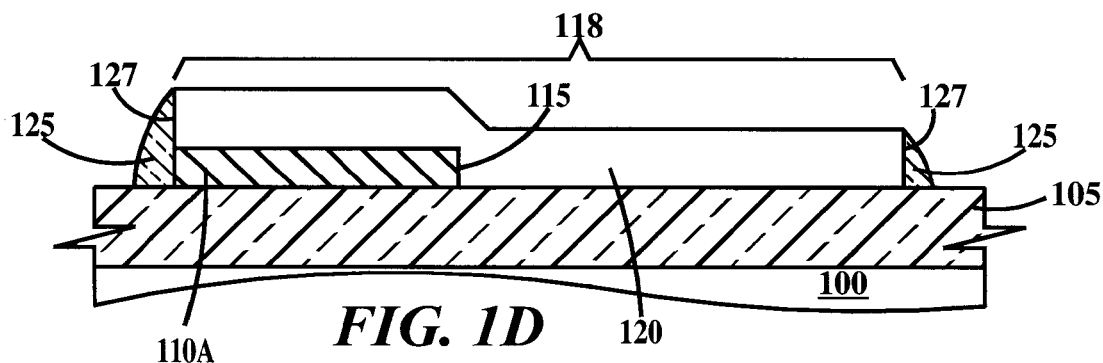

In FIG. 1D, polysilicon layer 120 and base layer 110 (see FIG. 1C) have been patterned (using conventional photolithographic methods and etch techniques well known in the art) to define a fuse shape 118 (see FIG. 2) having a cathode stack 110A formed from base layer 110. (It is called a cathode stack because the cathode contact of the fuse will be formed over this portion of the fuse shape). Then dielectric sidewall spacers 125 are formed on all sidewalls 127 of fuse shape 118.

Figure 1E:
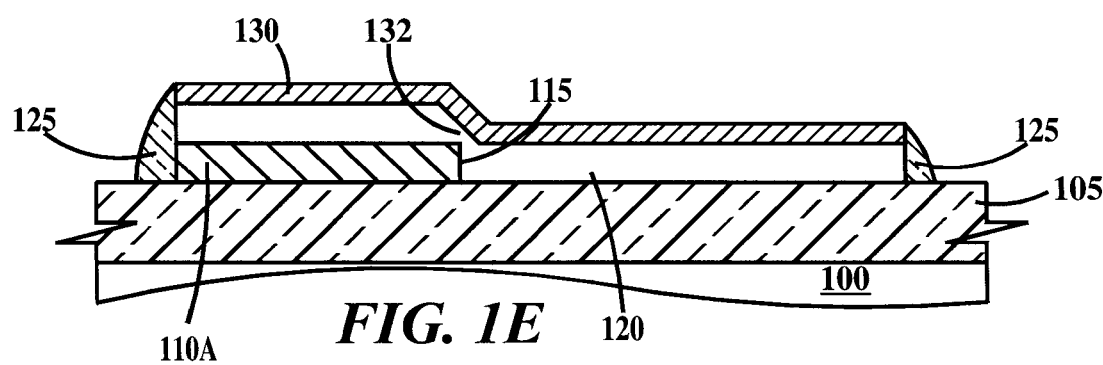

In FIG. 1E, a metal silicide layer 130 is formed on polysilicon layer 120 where the polysilicon layer is not protected by sidewall spacers 125. Metal silicide layer 130 may be formed by depositing a layer of metal on polysilicon layer 120, heating to a temperature significantly higher than room temperature (e.g., about 500° C. or higher) to cause a reaction between the metal and silicon, and then removing any unreacted metal. A layer of polysilicon layer 120 adjacent to the top surface of the polysilicon layer is consumed in this process, so a transition region 132 of polysilicon layer 120 proximate to sidewall 115 is significantly thinner than other regions of the polysilicon layer on cathode stack 110A and dielectric layer 105. In one example, silicide layer 130 comprises platinum silicide, nickel silicide, cobalt silicide or combinations thereof. In one example, silicide layer 130 has a thickness between about 5 nm to about 30 nm.

In FIG. 1F, an interlevel dielectric layer 135 is formed over silicide layer 120, spacers 125 and any exposed dielectric layer 105 and in FIG. 1G, a cathode contact 140A is formed through dielectric layer 135 to silicide layer 130 over cathode stack 110A and an anode contact 140B is formed to silicide layer 130 away from cathode stack 110A.

FIG. 2 is a plan view of the fuse according to the first embodiment of the present invention. In FIG. 2, it can be seen that fuse shape 118 (heavy line) has a cathode region 142 and an opposite anode region 143 connected by a link region 144. Cathode region 142, anode region and link region are integrally formed in both polysilicon layer 120 and silicide layer 130 which are co-extensive. A width W1 of link region 144 is advantageously less than respective widths W2 and W3 of cathode and anode regions 142 and 144.

Application of programming current between cathode contact 140A and anode contact 140B cause electromigration of metal silicide in the direction from cathode region 142 to anode region 143. The reduced width of link region 144 crowds the programming current in transition region 132, increasing the current density. Current density is also increased by current crowding in transition region 132 of polysilicon layer 120 because the polysilicon layer is thinner in region 132 than cathode region 142, anode region 143 and link region 144. These first two effects increase silicide electromigration from transition region 132 to link region 144, increasing the resistance of the link region in the programmed or "blown," state. When cathode stack 110A is an electrical conductor, current density is decreased in cathode region 142, which acts to decrease silicide electromigration from cathode region 142 to the link region 144. This reduces the tendency of silicide to migrate from cathode region 142 to link region 144 during programming, which would decrease the resistance of the transition region in the programmed state and make sensing the state of the fuse unreliable.

Figure 3A:
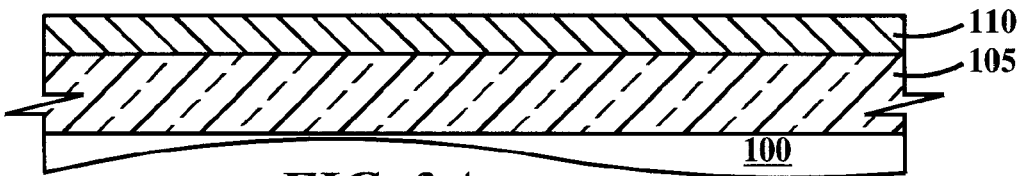
FIGS. 3A through 3G are cross-sectional drawings illustrating fabrication of an electromigration fuse according to a second embodiment of the present invention.
Figure 3B:
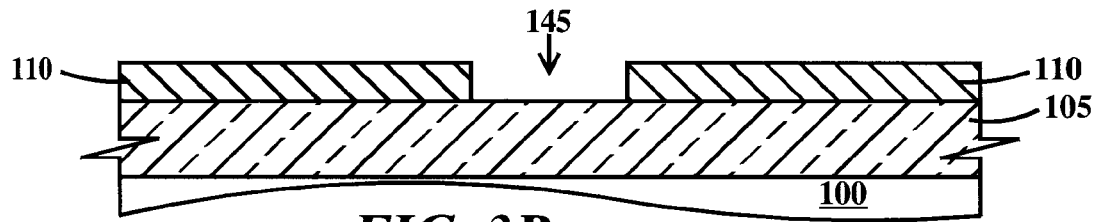
Figure 3C:
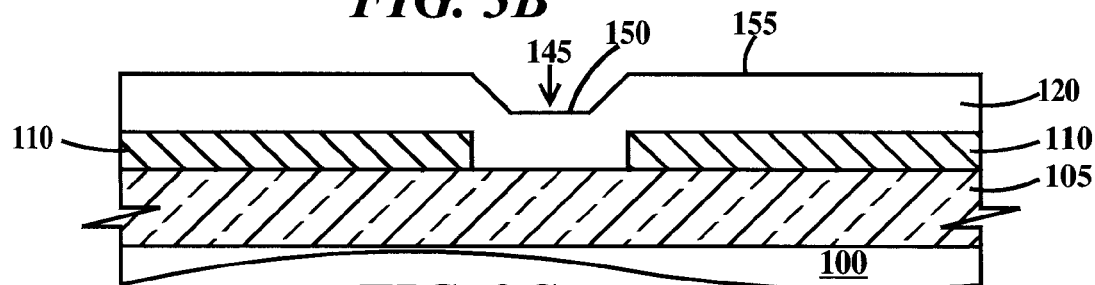
Figure 3D:
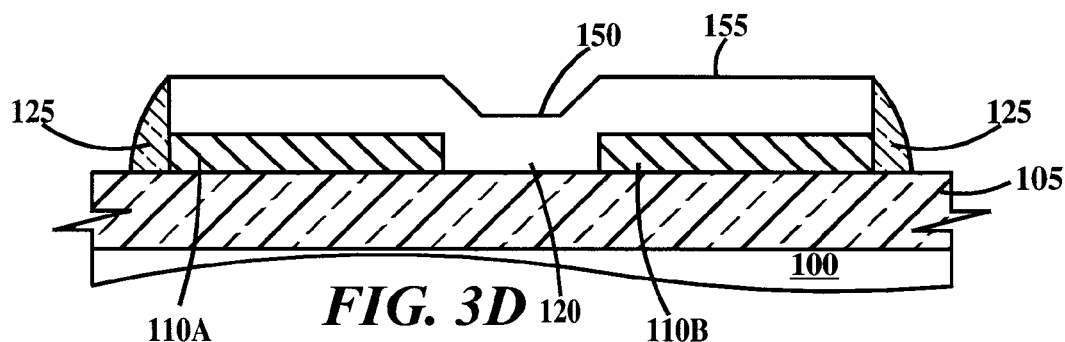
Figure 3E:
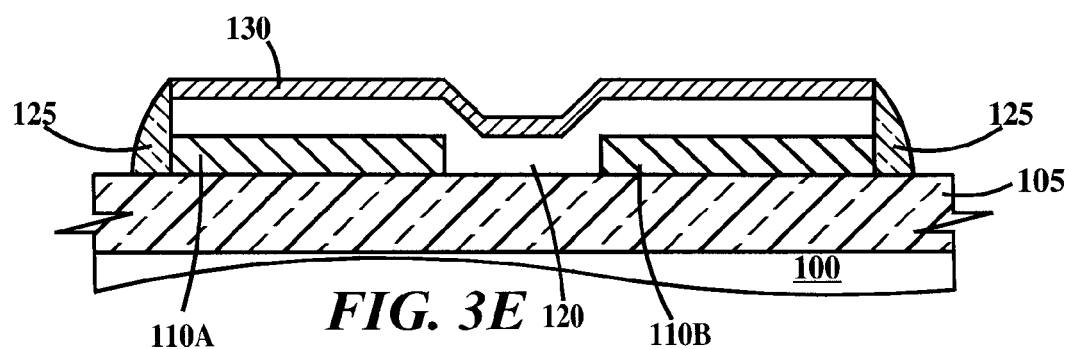
Figure 3F:
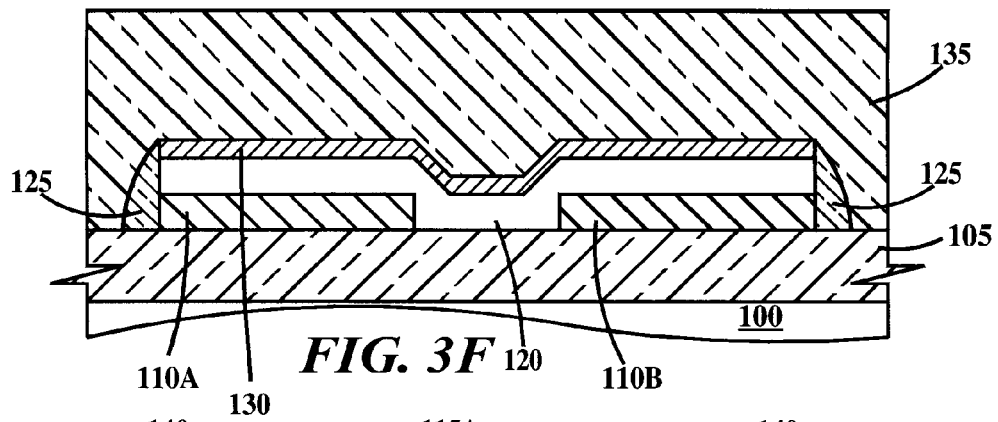
Figure 3G:
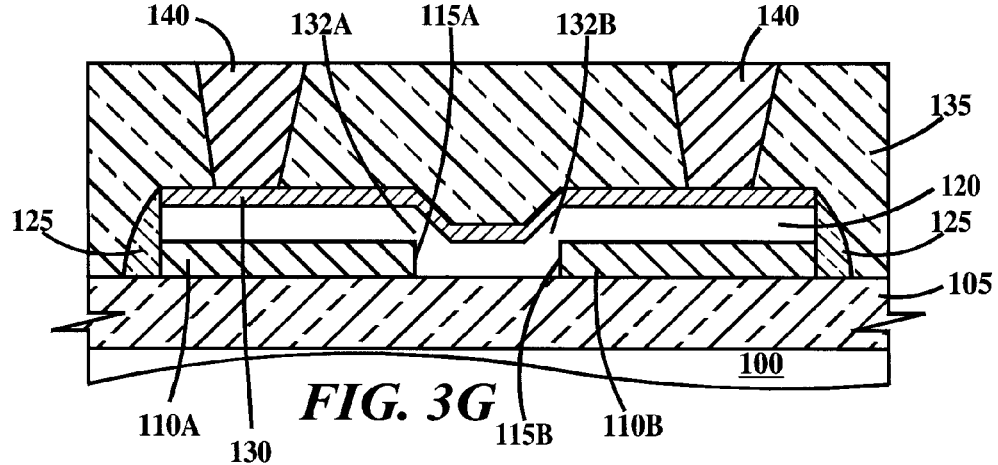
Figure 4:
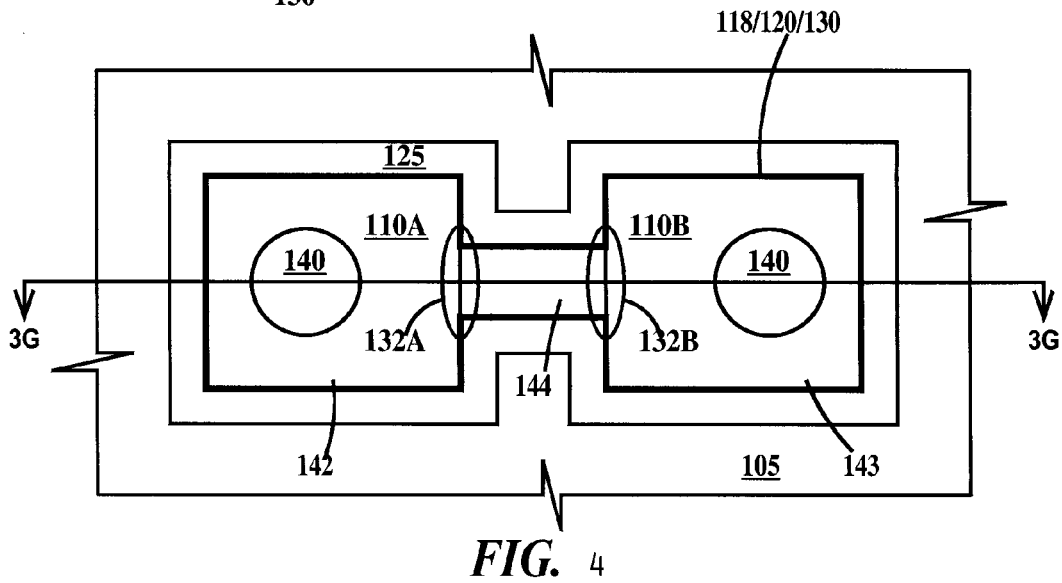
FIG. 4 is a plan view of the fuse according to the second embodiment of the present invention.

FIGS. 3A through 3G are cross-sectional drawings illustrating fabrication of an electromigration fuse according to a second embodiment of the present invention and FIG. 4 is a plan view of the fuse according to the second embodiment of the present invention. The difference between the first and second embodiments of the present invention is the second embodiment includes an anode stack in addition to the cathode stack. FIG. 3A is identical to FIG. 1A. In FIG. 3B, an opening 145 is formed in base layer 110. The top surface of dielectric layer 105 is exposed in the bottom of opening 145. In FIG. 3C, after formation of polysilicon layer 120, a depression is formed in a top surface 155 of polysilicon layer 120. In FIG. 3D, both cathode stack 110A and an anode stack 110B are defined and then sidewall spacers 125 are formed and in FIG. 3E, metal silicide layer 130 is formed. In FIG. 3F, dielectric layer 135 is formed and in FIG. 3G cathode contact 140A and anode contact 140B are formed. In FIG. 3G, anode contact 140B contact silicide layer 130 over anode stack 110B. In FIG. 4, there are two transition regions 132A and 132B proximate, respectively, to sidewall 115A of cathode stack 110A and to sidewall 115B of anode stack 110B. An advantage of the second embodiment of the present invention is that cathode and anode contacts 140A and 140B may be swapped simplifying circuit design. Also, although FIGS. 3A through 3F illustrate the anode and cathode stacks 110A and 110B being fabricated simultaneously from the same layer 110, they may be fabricated from different layers as in FIGS. 7A through 7E and described infra.

Figure 5A:
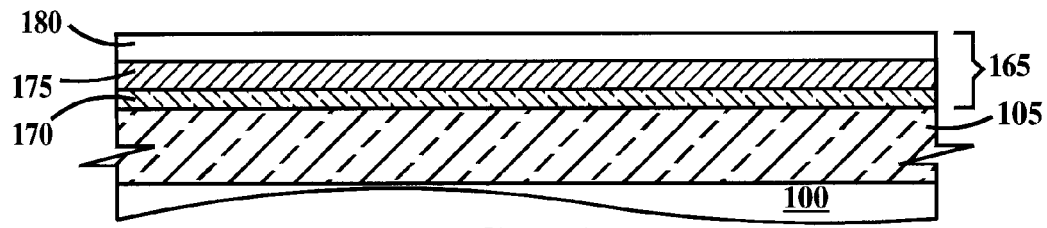
FIGS. 5A through 5D are cross-sectional drawings illustrating fabrication electromigration fuse having a first exemplary cathode stack according to the first embodiment of the present invention.
Figure 5B:
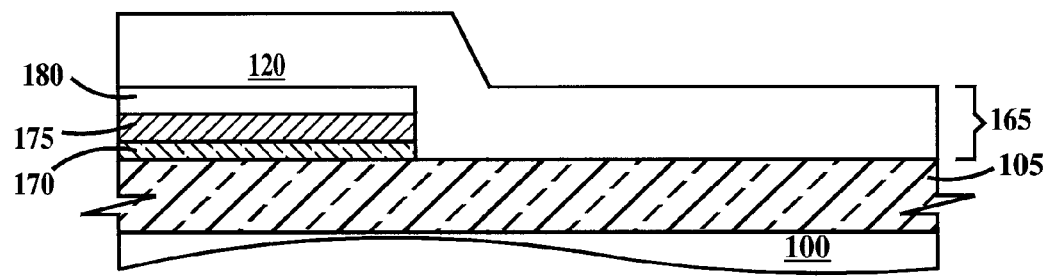
Figure 5C:
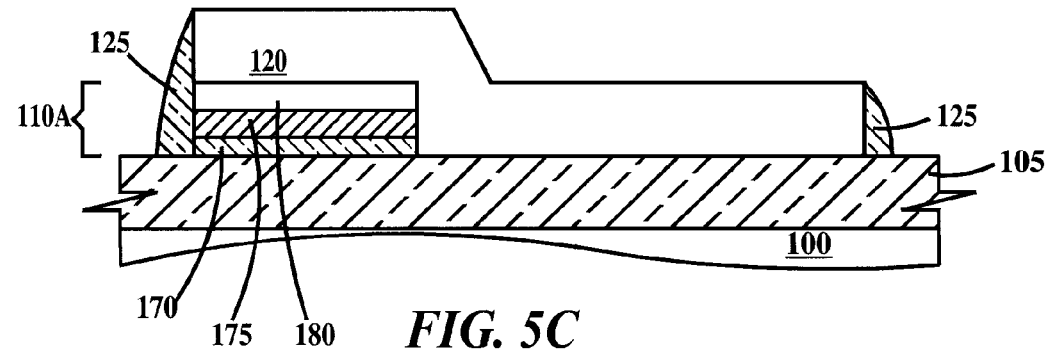
Figure 5D:
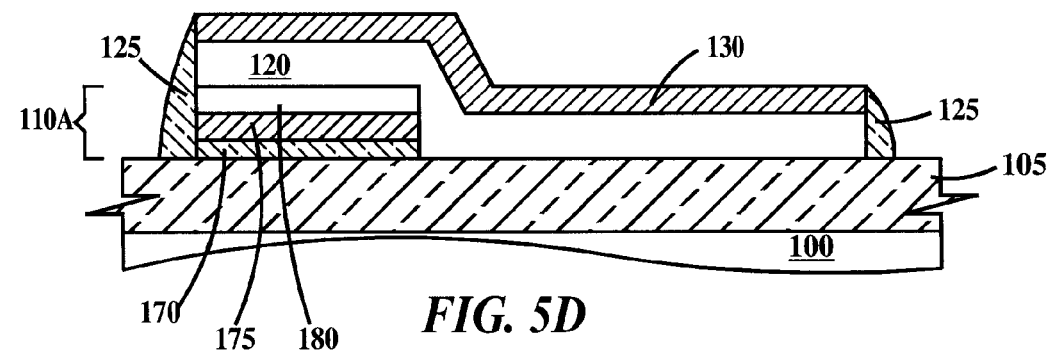

FIGS. 5A through 5D are cross-sectional drawings illustrating fabrication electromigration fuse having a first exemplary cathode stack according to the first embodiment of the present invention. FIGS. 5A through 5D replace FIGS. 1A through 1E of the first embodiment of the present invention and the essential difference is base layer 110 of FIGS. 1A and 1B is replaced by a stack 165 comprising a first layer 170 on the top surface of dielectric layer 105, a second layer 175 on the top surface of the first layer, and a third layer 180 on the top surface of the second layer and that in FIGS. 5C and 5D, cathode stack 110A comprises the first, second and third layers. In FIGS. 5C and 5D, polysilicon layer 180 is illustrated as separate from polysilicon layer 120, but polysilicon layer 180 may be viewed as merging integrally with and being incorporated into polysilicon layer 120 when polysilicon layer 120 is formed.

In one example, first layer 170 comprises a dielectric material such as silicon oxide, silicon nitride, a high dielectric constant (K) dielectric material (e.g., a material having K greater than or equal to about 10), a rare earth oxide (e.g., hafnium oxide), or combinations thereof. In one example, second layer 175 comprises an electrically conductive material such as titanium, tantalum and other metals, titanium nitride, tantalum nitride and other metal nitrides. In one example, third layer 180 comprises polysilicon. In one example first layer 170 is between about 1 nm and about 2 nm thick. In one example second layer 175 is between about 10 nm and about 20 nm thick. In one example third layer 180 is between about 20 nm and about 40 nm thick.

Figure 6A:
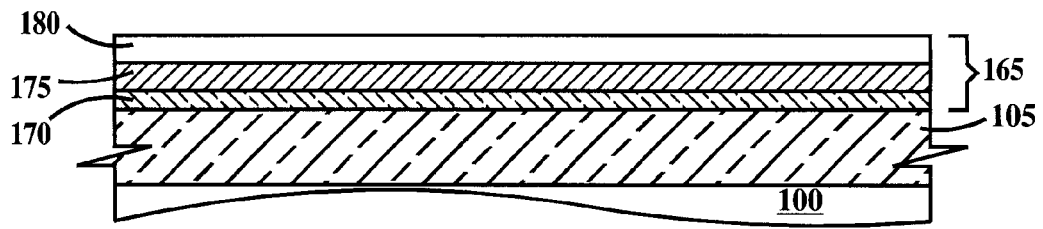
FIGS. 6A through 6D are cross-sectional drawings illustrating fabrication of an electromigration fuse having exemplary same cathode and anode stacks according to the second embodiment of the present invention.
Figure 6B:
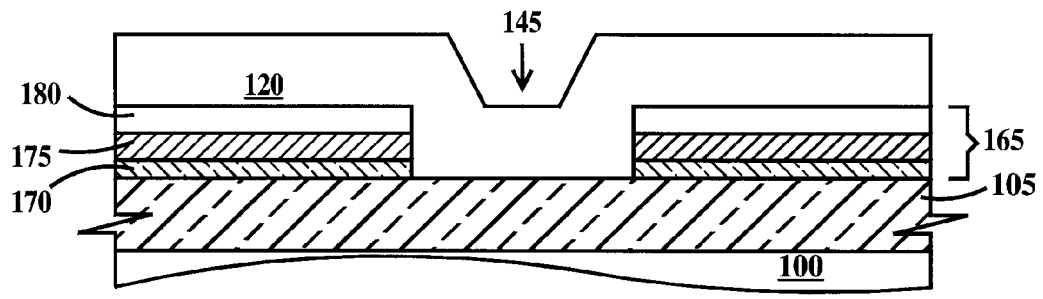
Figure 6C:
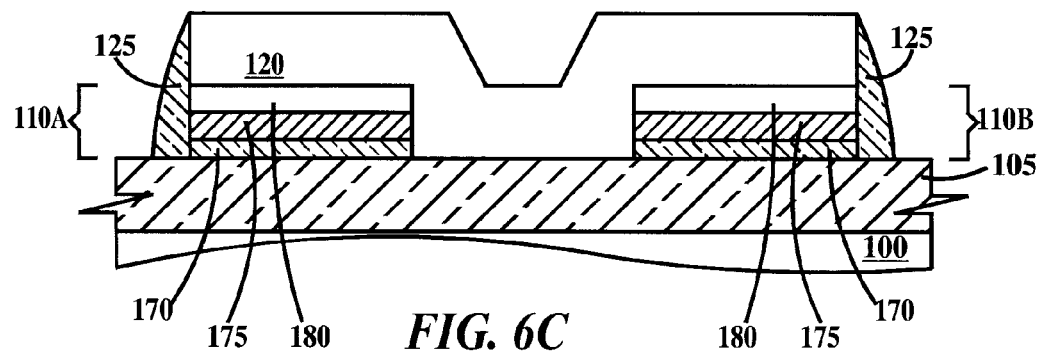
Figure 6D:
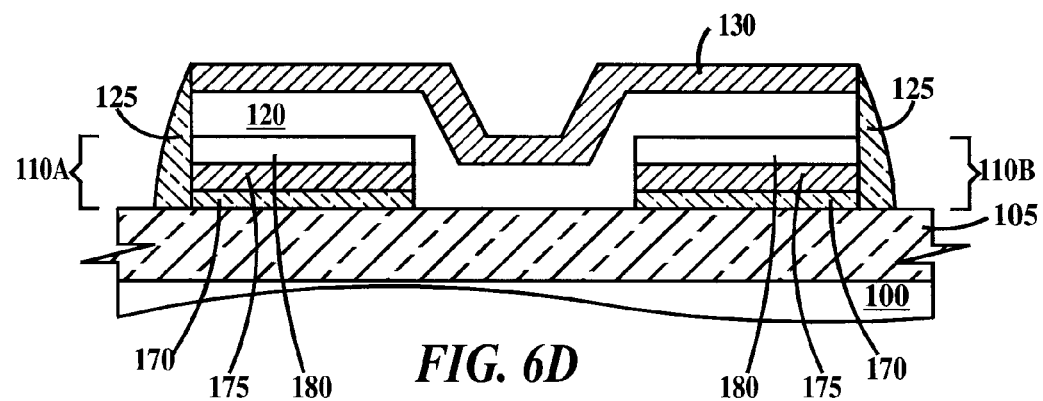

FIGS. 6A through 6D are cross-sectional drawings illustrating fabrication of an electromigration fuse having exemplary same cathode and anode stacks according to the second embodiment of the present invention. FIGS. 6A through 6D replace FIGS. 3A through 3E of the second embodiment of the present invention and the essential difference is layer 110 of FIGS. 3A and 3B is replaced by layer stack 165 comprising first layer 170 on the top surface of dielectric layer 105, second layer 175 on the top surface of the first layer, and third layer 180 on the top surface of the second layer and that in FIGS. 5C and 5D, cathode stack 110A and anode stack 110B both comprise the first, second and third layers. In FIGS. 6C and 6D, polysilicon layer 180 is illustrated as separate from polysilicon layer 120, but polysilicon layer 180 may be viewed as merging integrally with and being incorporated into polysilicon layer 120.

Figure 7A:
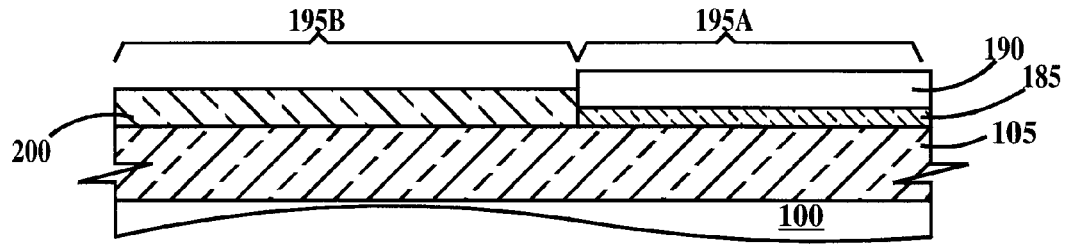
FIGS. 7A through 7F are cross-sectional drawings illustrating fabrication of an electromigration fuse having exemplary different cathode and anode stacks according to the second embodiment of the present invention.

FIGS. 7A through 7F are cross-sectional drawings illustrating fabrication of an electromigration fuse having exemplary different cathode and anode stacks according to the second embodiment of the present invention. FIGS. 7A through 7F replace FIGS. 3A through 3E of the second embodiment of the present invention. In FIG. 7A, a dielectric layer 185 has been formed on the top surface of a first region 195A of dielectric layer 105 and a polysilicon layer 190 has been formed on the top surface of dielectric layer 185. A dielectric layer 200 has been formed on the top surface of a second region 195B of dielectric layer 105. In one example dielectric layer 185 comprises silicon oxide, silicon-oxynitride or nitrided silicon oxide (silicon oxide into which nitrogen atoms have been incorporated after the silicon oxide has been formed). In one example dielectric layer 200 comprises a high-K material. In one example, dielectric layer 185 is between about 2 nm and about 3 nm thick. In one example, dielectric layer 190 is between about 20 nm and about 40 nm thick.

Figure 7B:
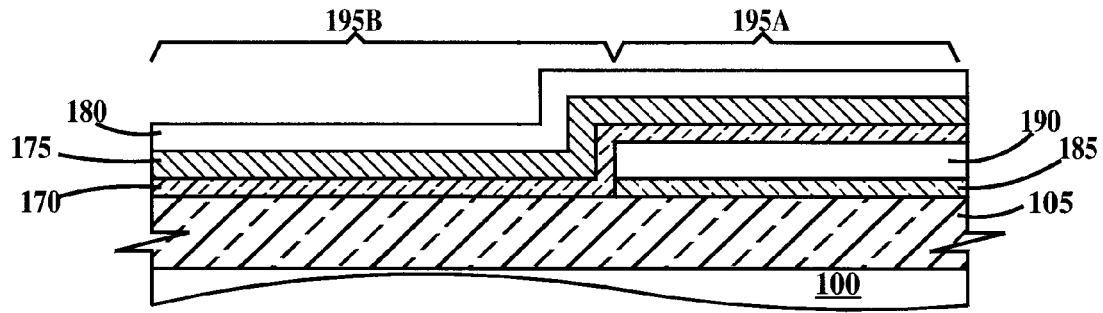

In FIG. 7B, dielectric layer 200 (see FIG. 7A) has been removed and first, second and third layers 170, 175 and 180 described supra have been formed on the first region 195B of dielectric layer 105 and on the top surface of polysilicon layer 190.

Figure 7C:
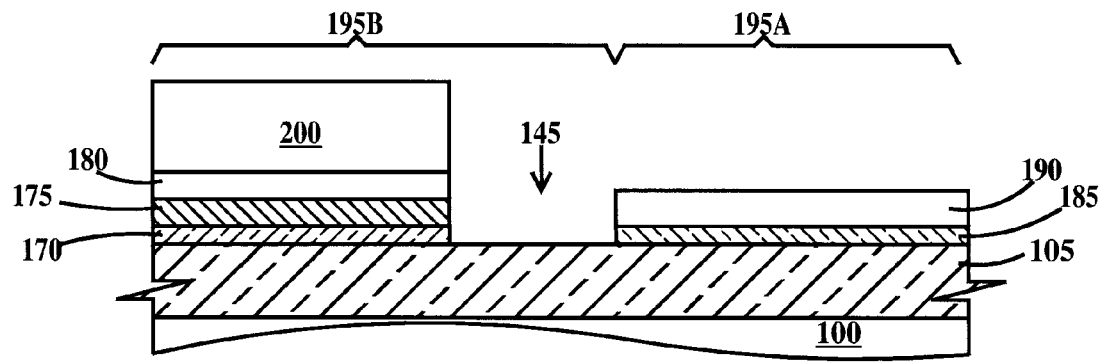

In FIG. 7C, a photoresist mask 200 has been formed on the top surface of third layer 180 in second region 195B but not in first region 195A. Then an etch has been performed remove the first, second and third layers 170, 175, and 180 where they are not protected by photoresist mask 200, forming opening 145. Dielectric layer 185 and polysilicon layer 190 are not removed in first region 195A.

Figure 7D:
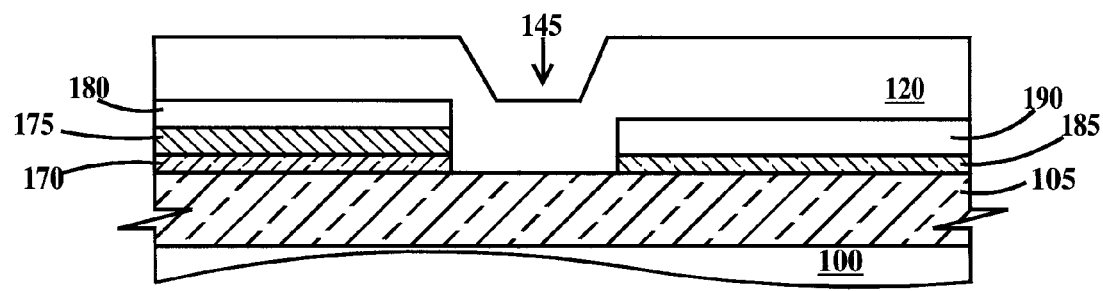
Figure 7E:
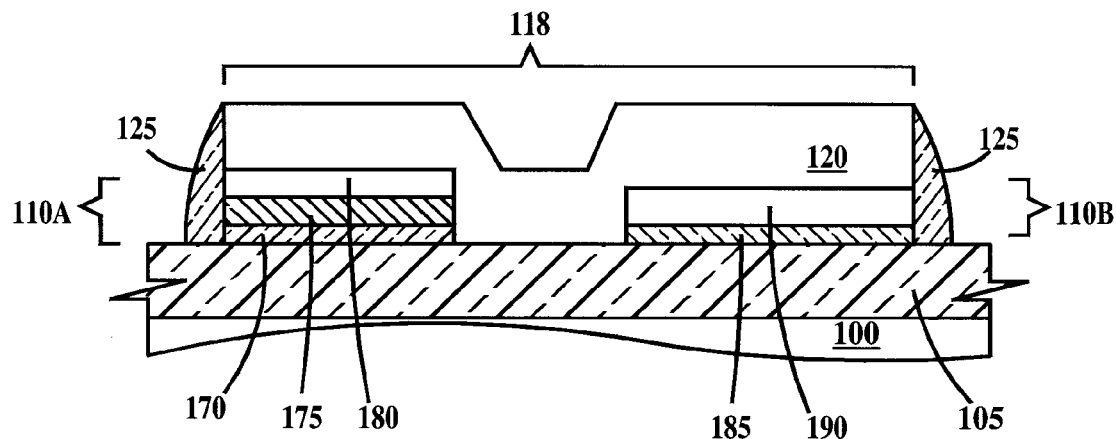

In FIG. 7D, polysilicon layer 120 is formed on the tops surfaces of polysilicon layers 180, 190 and the top surface of dielectric layer 105 exposed in opening 145. In FIG. 7E, fuse shape 118 is defined and in FIG. 7F, silicide layer 130 is formed. Thus, cathode stack 110A is different from anode stack 110B.

Figure 7F:
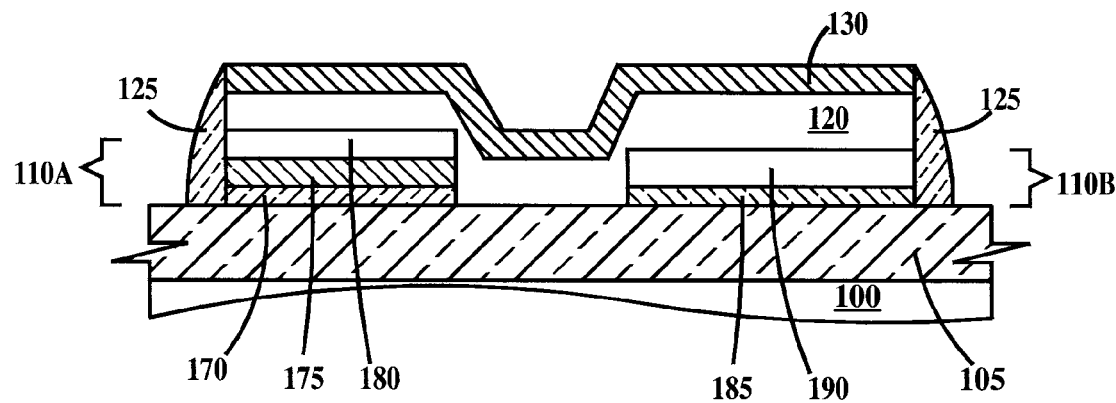

In FIGS. 7D, 7E and 7F, polysilicon layers 180 and 190 are illustrated as separate from polysilicon layer 120, but polysilicon layers 180 and 190 may be viewed as merging integrally with and being incorporated into polysilicon layer 120.

Thus, the embodiments of the present invention provide electromigration fuses and methods of making electromigration fuses that can be more reliably programmed at lower energies than convention electromigration fuses.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   a dielectric layer on a semiconductor substrate;
   a cathode stack on a top surface of said dielectric layer, a sidewall of said cathode stack extending from a top surface of said cathode stack to said top surface of said dielectric layer;
   a continuous polysilicon layer, said polysilicon layer comprising a cathode region, an anode region, a link region between said cathode and anode regions and a transition region between said cathode region and said link region, said transition region proximate to said sidewall of said cathode stack, said sidewall of said cathode stack under said transition region, said cathode region on a top surface of said cathode stack, said link region on a top surface of said dielectric layer, both a first thickness of said cathode region and a second thickness of said link region greater than a third thickness of said transition region; and
   a metal silicide layer on a top surface of said polysilicon layer.

2. The structure of claim 1, wherein said cathode stack comprises an additional dielectric layer, an electrically conductive layer, or said additional dielectric layer between said electrically conductive layer and said dielectric layer.

3. The structure of claim 1, further including;
   a dielectric sidewall spacer on all sidewalls of said cathode, transition, link and anode regions.

4. The structure of claim 1, wherein said cathode, transition, link and anode regions are sequentially arranged along a first direction and a first width of said link region in a second direction perpendicular to said first direction is less than a second width of said cathode region in said second direction.

5. The structure of claim 1, further including:
an anode stack on said top surface of said dielectric layer, a sidewall of said anode stack extending from a top surface of said anode stack to said top surface of said dielectric layer; and
said polysilicon layer further including an additional transition region between said link region and said anode region, said additional transition region proximate to said sidewall of said anode stack, said sidewall of said anode stack under said additional transition region, said anode region on a top surface of said anode stack, both said second thickness of said link region and a fourth thickness of said anode region greater than a fifth thickness of said additional transition region.

6. The structure of claim 5, wherein said cathode stack and said anode stack both comprise an additional dielectric layer, an electrically conductive layer, or said additional dielectric layer between said electrically conductive layer and said dielectric layer.

7. The structure of claim 5, further including;
a dielectric sidewall spacer on all sidewalls of said cathode, transition, link, additional transition and anode regions.

8. The structure of claim 5, wherein said cathode, transition, link, additional transition and anode regions are sequentially arranged along a first direction and wherein a first width of said link region in a second direction perpendicular to said first direction is less than a second width of said cathode region in said second direction and less than a third width of said anode region in said second direction.

9. The structure of claim 5, wherein said cathode stack and said anode stack comprise different numbers of layers, layers of different materials or both different numbers of layers and layers of different materials.

10. The structure of claim 5, wherein said cathode stack comprises a first additional dielectric layer between an electrically conductive layer and said dielectric layer and said anode stack consists of a second additional dielectric layer, said first additional dielectric layer different from said second additional dielectric layer.

11. A method, comprising:
forming a dielectric layer on a semiconductor substrate;
forming a cathode layer on a top surface of said dielectric layer;
removing a portion of said cathode layer to form a sidewall extending from a top surface of said cathode layer to said top surface of said dielectric layer;
forming a polysilicon layer on said top surface of said cathode layer, said sidewall of said cathode layer and said top surface of said dielectric layer;
simultaneously patterning said cathode layer into a cathode stack and patterning said polysilicon layer into a patterned polysilicon layer having a cathode region, an anode region, a link region between said cathode and anode regions and a transition region between said cathode region and said link region, said transition region proximate to said sidewall of said cathode stack, said sidewall of said cathode stack under said transition region, said cathode region on a top surface of said cathode stack, said link region on a top surface of said dielectric layer, said cathode region, said transition region, said link region and said anode region contiguous, a first thickness of said cathode region and a second thickness of said link region greater than a third thickness of said transition region; and
forming a metal silicide layer on a top surface of said patterned polysilicon layer.

12. The method of claim 11, wherein said cathode layer comprises (i) an additional dielectric layer, (ii) an electrically conductive layer, (iii) said additional dielectric layer between said electrically conductive layer and said dielectric layer, (iv) an additional polysilicon layer on a top surface of said an electrically conductive layer, or (v) said additional dielectric layer between said electrically conductive layer with said additional polysilicon layer on a top surface of said electrically conductive layer.

13. The method of claim 11, further including;
before forming said silicide layer, forming a dielectric sidewall spacer on all sidewalls of said cathode, transition, link and anode regions.

14. The method of claim 11, wherein said cathode, transition, link and anode regions are sequentially arranged along a first direction and wherein a first width of said link region in a second direction perpendicular to said first direction is less than a second width of said cathode region in said second direction.

15. A method, comprising:
forming a dielectric layer on a semiconductor substrate;
forming a cathode layer on a first region of said top surface of said dielectric layer;
forming an anode layer on a second region of said top surface of said dielectric layer, said first region of said top surface of said dielectric layer abutting said second region of said top surface of said dielectric layer;
removing a portion of said cathode layer adjacent to said anode layer to form a first sidewall extending from a top surface of said cathode layer to said top surface of said dielectric layer and to form a second sidewall extending from a top surface of said anode layer to said top surface of said dielectric layer;
forming a polysilicon layer on said top surface of said cathode layer, said first sidewall, said top surface of said anode layer, said second sidewall and said top surface of said dielectric layer;
simultaneously patterning said cathode layer into a cathode stack, said anode layer into an anode stack and said polysilicon layer into a patterned polysilicon layer, said patterned polysilicon layer having a cathode region, an anode region, a link region between said cathode and anode regions, a first transition region between said cathode region and said link region and a second transition region between said link region and said anode region, said first transition region proximate to said first sidewall and said second transition region proximate to said second sidewall, said first sidewall of said cathode stack under said first transition region and said second sidewall of said anode stack under said second transition region, said cathode region on a top surface of said cathode stack, said link region on said top surface of said dielectric layer, said anode region on a top surface of said anode stack, said cathode region, said first transition region, said link region, said second transition region and said anode region contiguous, both a first thickness of said cathode region and a second thickness of said link region greater than a third thickness of said first transition region, both a fourth thickness of said anode region and said second thickness of said link region greater than a fifth thickness of said second transition region; and
forming a metal silicide layer on a top surface of said patterned polysilicon layer.

16. The method of claim 15, wherein said cathode layer and said anode layer are a same layer comprising (i) an additional dielectric layer, (ii) an electrically conductive layer, (iii) said additional dielectric layer between said electrically conductive layer and said dielectric layer, (iv) an additional polysilicon layer on a top surface of said an electrically conductive layer, or (v) said additional dielectric layer between said electrically conductive layer with said additional polysilicon layer on a top surface of said electrically conductive layer.

17. The method of claim 15, further including;
forming a dielectric sidewall spacer on all sidewalls of said cathode, first transition, link, second transition and anode regions.

18. The method of claim 15, wherein said cathode, first transition, link, second transition and anode regions are arranged sequentially in a first direction, a first width of said link region in a second direction perpendicular to said first direction less than a second width of said cathode region in said second direction and less than a third width of said anode region in said second direction.

19. The method of claim 15, wherein said cathode layer and said anode layer comprise different numbers of layers, layers of different materials or both different numbers of layers and layers of different materials.

20. The method of claim 15, wherein said cathode layer consists of a first additional dielectric layer between an electrically conductive layer and said dielectric layer with a first additional polysilicon layer on a top surface of said electrically conductive layer and said anode layer consists of a second additional dielectric layer with a second additional polysilicon layer on a top surface of said second additional dielectric layer, said first additional dielectric layer different from said second additional dielectric layer, said first additional polysilicon layer different from said second additional polysilicon layer.

* * * * *